(12) United States Patent
Fitz et al.

(10) Patent No.: US 8,765,586 B2
(45) Date of Patent: Jul. 1, 2014

(54) METHODS OF FORMING METAL SILICIDE REGIONS ON SEMICONDUCTOR DEVICES

(75) Inventors: Clemens Fitz, Dresden (DE); Peter Baars, Dresden (DE); Markus Lenski, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 271 days.

(21) Appl. No.: 13/331,842

(22) Filed: Dec. 20, 2011

(65) Prior Publication Data

US 2013/0157450 A1 Jun. 20, 2013

(51) Int. Cl.
*H01L 21/3205* (2006.01)
*H01L 21/4763* (2006.01)

(52) U.S. Cl.
USPC ........... 438/586; 438/287; 438/300; 438/660; 438/682; 438/721; 257/E21.19; 257/E21.158; 257/E21.159

(58) Field of Classification Search
None
See application file for complete search history.

(56) References Cited

U.S. PATENT DOCUMENTS

| 6,265,291 | B1 | 7/2001 | Yu et al. |
| 6,440,867 | B1 | 8/2002 | Besser et al. |
| 6,440,868 | B1 * | 8/2002 | Besser et al. ............... 438/721 |
| 6,461,905 | B1 | 10/2002 | Wang et al. |
| 6,927,117 | B2 | 8/2005 | Cabral, Jr. et al. |
| 7,029,966 | B2 | 4/2006 | Amos et al. |
| 7,056,782 | B2 | 6/2006 | Amos et al. |
| 7,138,308 | B2 | 11/2006 | Cheng et al. |
| 8,039,388 | B1 | 10/2011 | Ng et al. |
| 2005/0133817 | A1 * | 6/2005 | Huang et al. ............... 257/192 |
| 2006/0160361 | A1 * | 7/2006 | Jung et al. ............... 438/682 |
| 2006/0237821 | A1 * | 10/2006 | Lee et al. ............... 257/635 |
| 2012/0122284 | A1 * | 5/2012 | Kim et al. ............... 438/287 |
| 2012/0156873 | A1 * | 6/2012 | Luo et al. ............... 438/660 |

* cited by examiner

*Primary Examiner* — Charles Garber
*Assistant Examiner* — Abdulfattah Mustapha
(74) *Attorney, Agent, or Firm* — Amerson Law Firm, PLLC

(57) ABSTRACT

Disclosed herein are various methods of forming metal silicide regions on semiconductor devices. In one example, the method includes forming a sacrificial gate structure above a semiconducting substrate, performing a selective metal silicide formation process to form metal silicide regions in source/drain regions formed in or above the substrate, after forming the metal silicide regions, removing the sacrificial gate structure to define a gate opening and forming a replacement gate structure in the gate opening, the replacement gate structure comprised of at least one metal layer.

19 Claims, 10 Drawing Sheets

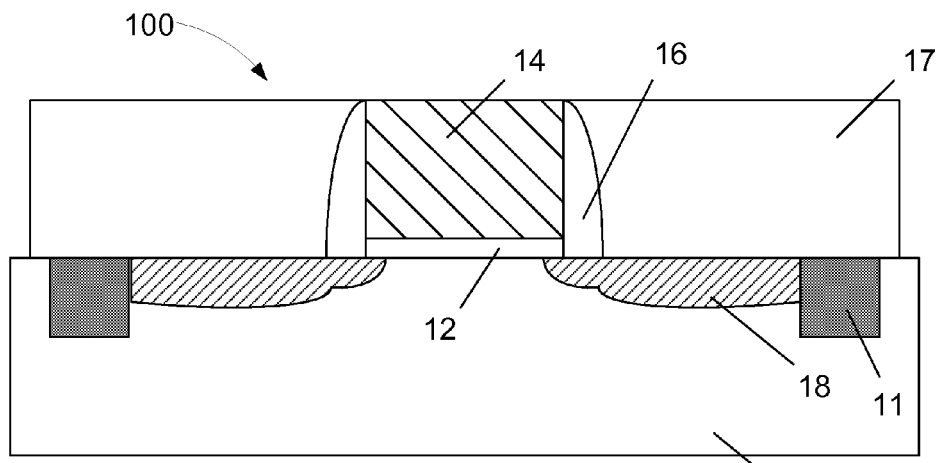
(Prior Art) Figure 1A
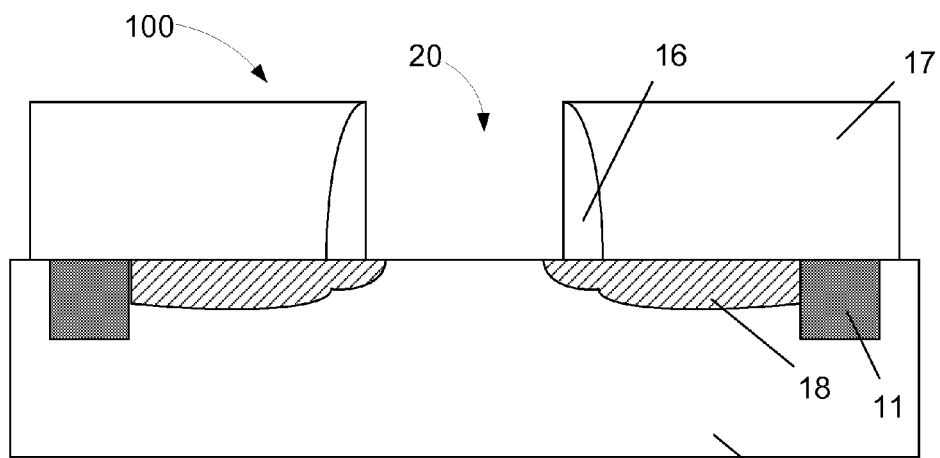
(Prior Art) Figure 1B

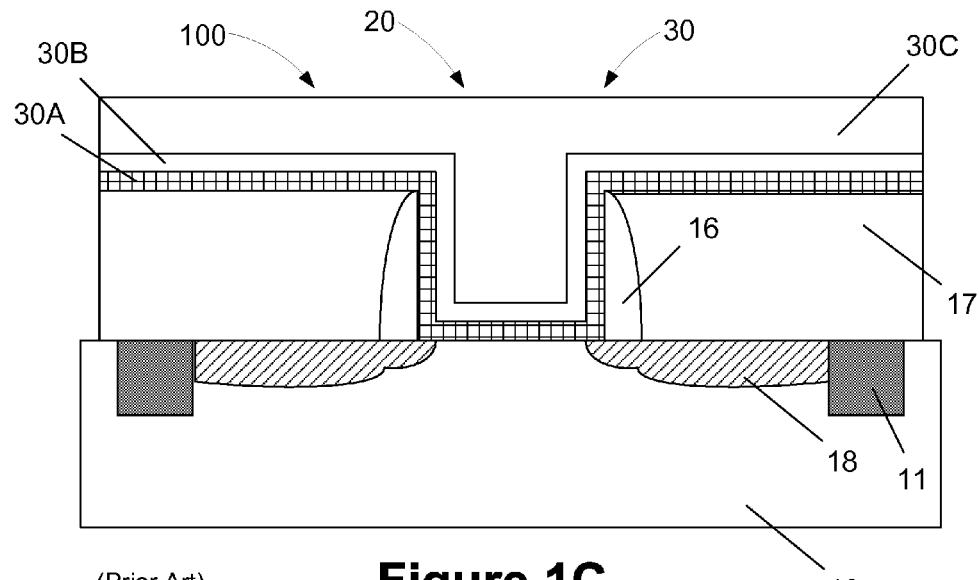
(Prior Art) Figure 1C
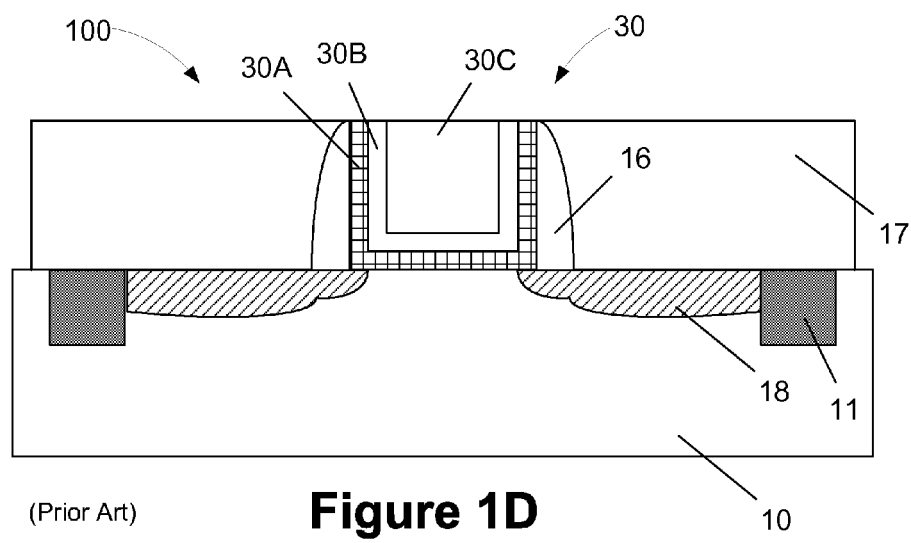
(Prior Art) Figure 1D

METHODS OF FORMING METAL SILICIDE REGIONS ON SEMICONDUCTOR DEVICES

BACKGROUND OF THE INVENTION

1. Field of the Invention

Generally, the present disclosure generally relates to the manufacturing of sophisticated semiconductor devices, and, more specifically, to various methods of forming metal silicide regions on semiconductor devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. A field effect transistor, irrespective of whether an NMOS transistor or a PMOS transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

For many early device technology generations, the gate electrode structures of most transistor elements has comprised a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short-channel effects which may be associated with the use of traditional silicon-based materials in reduced channel length transistors. For example, in some aggressively scaled transistor elements, which may have channel lengths of on the order of approximately 14-32 nm, gate electrode stacks comprising a so-called high-k dielectric/metal gate (HK/MG) configuration have been shown to provide significantly enhanced operational characteristics over the heretofore more commonly used silicon dioxide/polysilicon (SiO/poly) configurations. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi), and the like.

One well-known processing method that has been used for forming a transistor with a high-k/metal gate structure is the so-called "gate last" or "replacement gate" technique. FIGS. 1A-1D depict one illustrative prior art method for forming an HK/MG replacement gate structure using a gate-last technique. As shown in FIG. 1A, the process includes the formation of a basic transistor structure 100 above a semiconducting substrate 10 in an active area defined by a shallow trench isolation structure 11. At the point of fabrication depicted in FIG. 1A, the device 100 includes a sacrificial gate insulation layer 12, a dummy or sacrificial gate electrode 14, sidewall spacers 16, a layer of insulating material 17 and source/drain regions 18 formed in the substrate 10. The various components and structures of the device 100 may be formed using a variety of different materials and by performing a variety of known techniques. For example, the sacrificial gate insulation layer 12 may be comprised of silicon dioxide, the sacrificial gate electrode 14 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopant for PMOS devices) that are implanted into the substrate 10 using known masking and ion implantation techniques. Of course, those skilled in the art will recognize that there are other features of the transistor 100 that are not depicted in the drawings for purposes of clarity. For example, so called halo implant regions are not depicted in the drawings as well as various layers or regions of silicon germanium that are typically found in high-performance PMOS transistors. At the point of fabrication depicted in FIG. 1A, the various structures of the device 100 have been formed and a chemical mechanical polishing process (CMP) has been performed to remove any materials above the sacrificial gate electrode 14 (such as a protective cap layer (not shown) comprised of silicon nitride) so that the sacrificial gate electrode 14 may be removed.

As shown in FIG. 1B, one or more etching processes are performed to remove the sacrificial gate electrode 14 and the sacrificial gate insulation layer 12 to thereby define a gate opening 20 where a replacement gate structure will subsequently be formed. A masking layer that is typically used in such etching processes is not depicted for purposes of clarity. Typically, the sacrificial gate insulation layer 12 is removed as part of the replacement gate technique, as depicted herein. However, the sacrificial gate insulation layer 12 may not be removed in all applications.

Next, as shown in FIG. 1C, various layers of material that will constitute a replacement gate structure 30 are formed in the gate opening 20. In one illustrative example, the replacement gate structure 30 is comprised of a high-k gate insulation layer 30A having a thickness of approximately 2 nm, a work-function adjusting layer 30B comprised of a metal (e.g., a layer of titanium nitride with a thickness of 2-5 nm) and a bulk metal layer 30C (e.g., aluminum). Ultimately, as shown in FIG. 1D, a CMP process is performed to remove excess portions of the gate insulation layer 30A, the work-function adjusting layer 30B and the bulk metal layer 30C positioned outside of the gate opening 20 to define the replacement gate structure 30.

In a field effect transistor, metal silicide regions are typically formed in the source/drain regions of a transistor to reduce the resistance when a conductive contact is formed to establish electrical connection to the source/drain regions. The typical steps performed to form metal silicide regions are: (1) depositing a layer of refractory metal; (2) performing an initial heating process causing the refractory metal to react with underlying silicon containing material; (3) performing an etching process to remove unreacted portions of the layer of refractory metal and (4) performing an additional heating process to form the final phase of the metal silicide. The details of such silicidation processes are well known to those skilled in the art.

The present disclosure is directed to various, more efficient methods of forming metal silicide regions on semiconductor devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming metal silicide regions on semiconductor devices. In one example, the method includes forming a sacrificial gate structure above a semiconducting substrate, performing a selective metal silicide formation process to form metal silicide regions in source/drain regions formed in or above the substrate, after forming the metal silicide regions, removing the sacrificial gate structure to define a gate opening and forming a replacement gate structure in the gate opening, the replacement gate structure comprised of at least one metal layer.

In another illustrative example, the method includes forming a plurality of sacrificial gate structures above a semiconducting substrate, forming a sidewall spacer proximate each of the sacrificial gate structures and forming a protective gate cap layer above each of the sacrificial gate structures. In this embodiment, the method further includes the steps of performing a selective metal silicide formation process to form a metal silicide region in a source/drain region formed in or above the substrate between the sacrificial gate structures and to form a first metal layer on at least the sidewall spacer and after performing the selective metal silicide formation process, performing a metal deposition process to form a second metal layer above the metal silicide region at least between the sidewall spacers on the sacrificial gate structures and performing a planarization process on at least the second metal layer to define a contact structure positioned above the metal silicide region between the sidewall spacers on the sacrificial gate structures.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art process flow for forming a semiconductor device using a gate last approach;

Figure 2A:
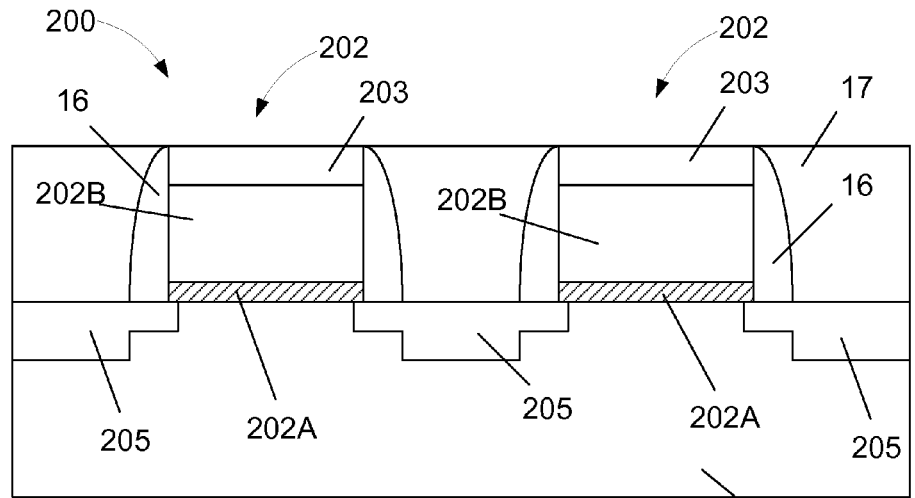
FIGS. 2A-2H depict various illustrative examples of using one illustrative technique disclosed herein to form metal silicide regions on a semiconductor device and/or conductive contacts for the semiconductor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming metal silicide regions on semiconductor devices. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. With reference to FIGS. 2A-2H, FIGS. 3A-3D and FIGS. 4A-4D, various illustrative embodiments of the methods and devices disclosed herein will now be described in more detail. To the extent that the same reference numbers are used in FIGS. 1A-1D and FIG. 2A-2H, 3A-3D, or 4A-4D, the previous description of those structures applies equally to FIG. 2A-2H, 3A-3D, or 4A-4D.

FIG. 2A is a simplified view of an illustrative semiconductor device 200 at an early stage of manufacturing that is formed above a semiconducting substrate 10. At the point of fabrication depicted in FIG. 2A, the device 200 includes a plurality of sacrificial gate structure 202 and sidewall spacers 16 positioned in a layer of insulating material 17 formed above a substrate 10. In the depicted example, the each of the sacrificial gate electrode structure 202 includes a sacrificial gate insulation layer 202A and a sacrificial gate electrode 202B. An illustrative gate cap layer 203 is formed above the sacrificial gate electrode structure 202B. In general, in FIG. 2A, the device 200 is depicted at the point of fabrication that corresponds to that depicted in FIG. 1A for the device 100. Thus, the discussion about illustrative materials and methods of manufacture employed in making the device 100 apply equally to the device 200 up to this point of fabrication. Of course, to the extent that like numbers of various components is used, the previous discussion of those components in connection with the device 100 applies equally as well to the device 200. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 10 may also be made of materials other than silicon.

The various components and structures of the device 200 may be formed using a variety of different materials and by performing a variety of known techniques. For example, the sacrificial gate insulation layer 202A may be comprised of silicon dioxide, the sacrificial gate electrode 202B may be comprised of polysilicon, the sidewall spacers 16 and the gate cap layer 203 may be comprised of silicon nitride and the layer of insulating material 17 may be comprised of silicon dioxide. The sacrificial gate electrode 202B and the sacrificial gate insulation layer 202A may be of any desired thickness or configuration. In one example, the sacrificial gate electrode 202B may have a critical dimension of 20 nm or less. Also shown in FIG. 2A are illustrative, schematically depicted source/drain regions 205 that are formed in the substrate 10. The source/drain regions 205 are typically comprised of implanted dopant materials (N-type dopants for NMOS devices and P-type dopant for PMOS devices) that are implanted into the substrate 10 using known masking and ion implantation techniques are not depicted. Of course, those skilled in the art will recognize that there are other features of the device 200 that are not depicted in the drawings so as not to obscure the present invention. For example, so called halo implant regions and various layers or regions of silicon germanium that are typically found in high-performance PMOS transistors are not depicted in the drawings. Lastly, the device 200 may be provided with raised or planar source/drain regions. For simplification, the device 200 will be depicted as if planar source/drain regions are formed in the substrate 10. At the point of fabrication depicted in FIG. 2A, the various structures of the device 200 have been formed and a chemical mechanical polishing process (CMP) has been performed to remove any materials above the protective gate cap layer 203.

Figure 2B:
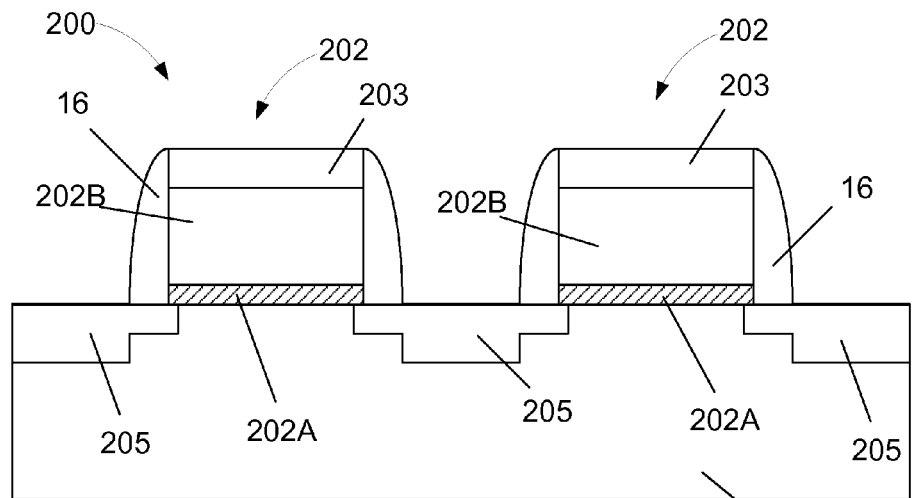

Next, as shown in FIG. 2B, one or more etching processes are performed to remove the layer of insulating material 17 and thereby expose the substrate 10 and the source/drain regions 205 for further processing. The etching process may be either a wet or dry etching process. The etching process uses an etch chemistry that selectively removes the layer of insulating material 17 relative to the sidewall spacers 16 and the gate cap layer 203, although these structures may suffer some erosion during the etching process. However, any erosion of the spacers 16 and the gate cap layer 203 is not depicted in the drawings.

Figure 2C:
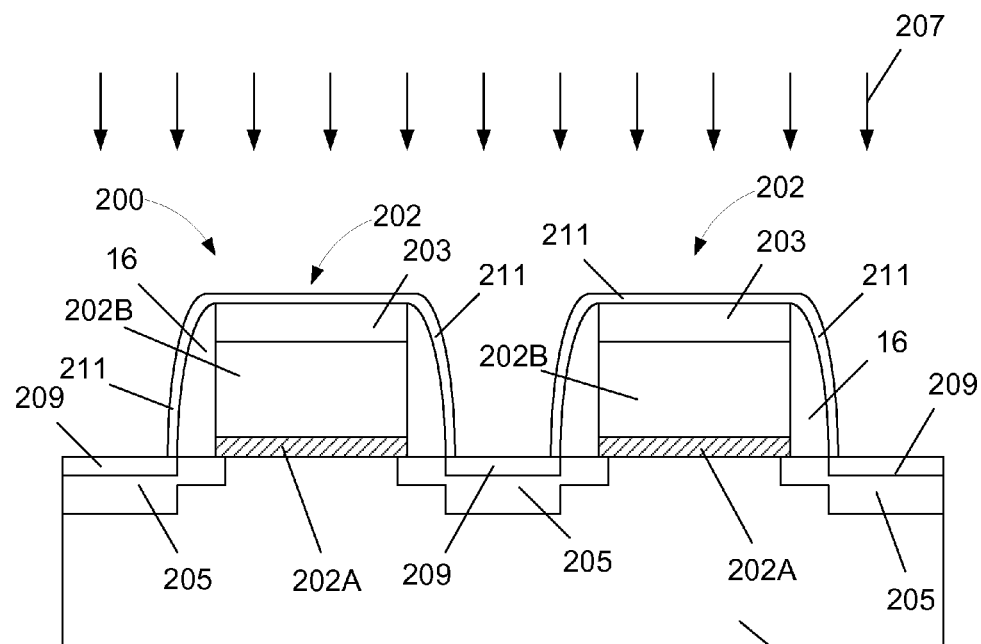

Next, as shown in FIG. 2C, a metal silicide formation process 207 is performed on the device 200 to form metal silicide regions 209 in the source/drain regions 205. In one illustrative embodiment, the metal silicide formation process 207 is a selective metal silicide formation process that begins with a relatively low temperature process whereby a metal layer 211 is formed on exposed surfaces and the temperature is increased, either during or after the formation of the initial metal layer 211, so as to ultimately form a metal silicide region at the location where the metal layer 211 is in contact with a silicon surface, i.e., the source/drain regions 205. In a more specific example, the metal layer 211 and the silicide formation is performed in situ, i.e., in the same process chamber whereby the temperature of the deposition process itself is so high, e.g., 300-450° C. for a nickel silicide, that enough thermal energy is provided to automatically cause the formation of the metal silicide regions. For a titanium silicide region, the layer of titanium could be deposited at a temperature of about 500-550° C. and titanium silicide will form where the layer of titanium is in contact with silicon. Simply put, in one embodiment disclosed herein, the metal deposition process is performed at a temperature that is at least high enough to automatically convert the portions of the metal layer that are in contact with silicon to a metal silicide. Of course, the exact temperature at which the deposition process is performed will vary depending upon the particular metal layer/metal silicide to be formed as the temperature at which a metal silicide forms depends upon the particular metal silicide at issue. By forming the resulting metal silicide regions 209 directly as a result of the metal silicide formation process 207, i.e., the metal deposition process, the present methods enable the formation of the metal silicide regions 209 in a more cost-efficient manner that involves fewer steps. For example, using this technique, the prior art silicidation steps of heating a deposited layer of refractory metal, stripping the unreacted portions of the refractory metal and performing a heating process to convert the metal silicide to a desirable final phase may be omitted if desired.

The metal silicide regions 209 may be made of a variety of different metal silicides, e.g., titanium silicide, etc. The thickness of the metal silicide regions 209 may vary depending upon a variety of factors, such as the parameters of the metal silicide formation process 207, etc. In one illustrative embodiment, the metal silicide regions 209 may have a thickness that ranges from about 10-30 nm, while the metal silicide layer 211 may have a thickness of about 1-3 nm, although these thicknesses may vary depending upon the particular application.

Figure 2D:
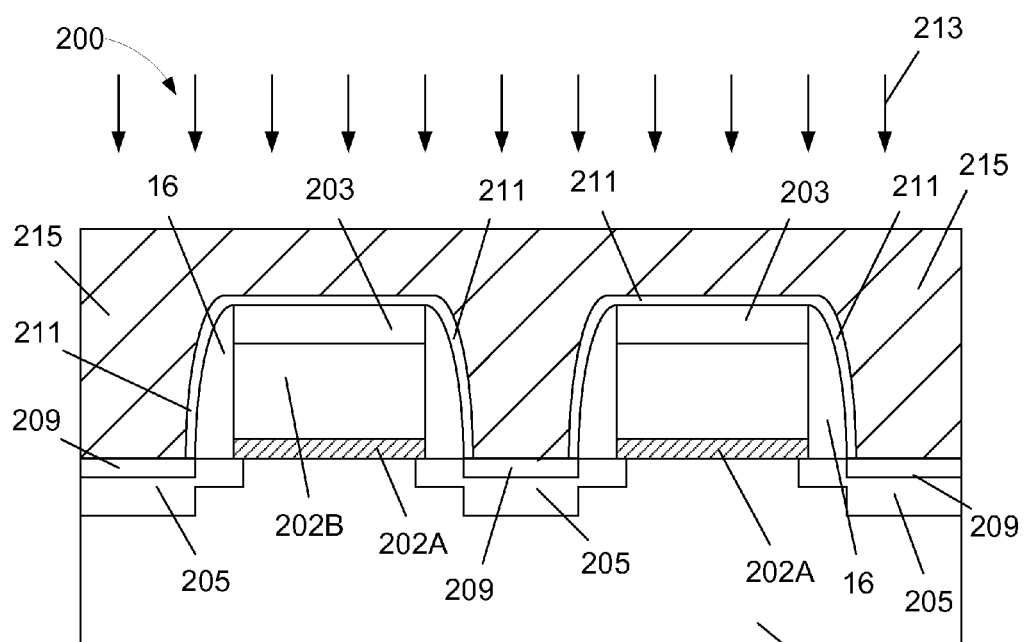

In one illustrative embodiment, the metal silicide formation process 207 initially involves performing a plasma enhance chemical vapor deposition (PECVD) based process that is performed at a relatively high temperature, e.g., 500° C. or greater, although other deposition processes and temperatures may be employed, e.g., atomic layer deposition (ALD), etc. In one very specific example, the metal silicide formation process 207 may be performed at a temperature of 550° C. (or greater) for a duration of about 1-2 minutes using titanium tetrachloride (TiCl$_4$) as a precursor Next, as shown in FIG. 2D, in one illustrative embodiment, the process gases used in the metal silicide formation process 207 are changed and a metal deposition process 213 is performed to form a metal layer 215 above the device 200. In one illustrative embodiment, the metal deposition process 213 may be performed in situ, i.e., in the same process chamber in which the metal silicide formation process 207 was performed without removing the device 200 from the process chamber. In other illustrative embodiments, the metal deposition process 213 may be performed as a stand-alone process in a separate process chamber or tool. In one particular example, where the metal deposition process 213 is performed in situ, after the metal silicide formation process 207 is performed, the metal deposition process 213 involves introducing nitrogen at a flow rate of about 10-200 slm into the process chamber, and the process is performed at a temperature or about 450° C. or greater for a duration of about 1-3 min. In this illustrative example, the metal deposition process 213 results in the formation of a titanium nitride metal layer 215 having a thickness of about 20-100 nm.

Figure 2E:
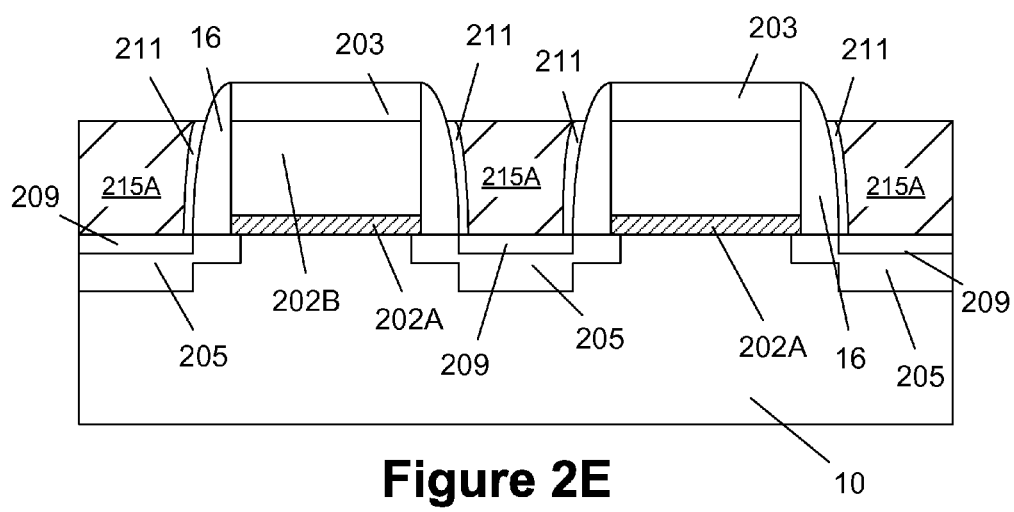

Next, as shown in FIG. 2E, a wet or dry etching process is performed to remove portions of the metal layer 215 and the metal layer 211. This etching process results in the formation of self-aligned conductive contacts 215A that are conductively coupled to the metal silicide regions 209. Note that portions of the metal layer 211 remain positioned between the sidewall spacer 16 and the conductive contacts 215A. The conductive contacts 215A may be of any desired shape or configuration.

Figure 2F:
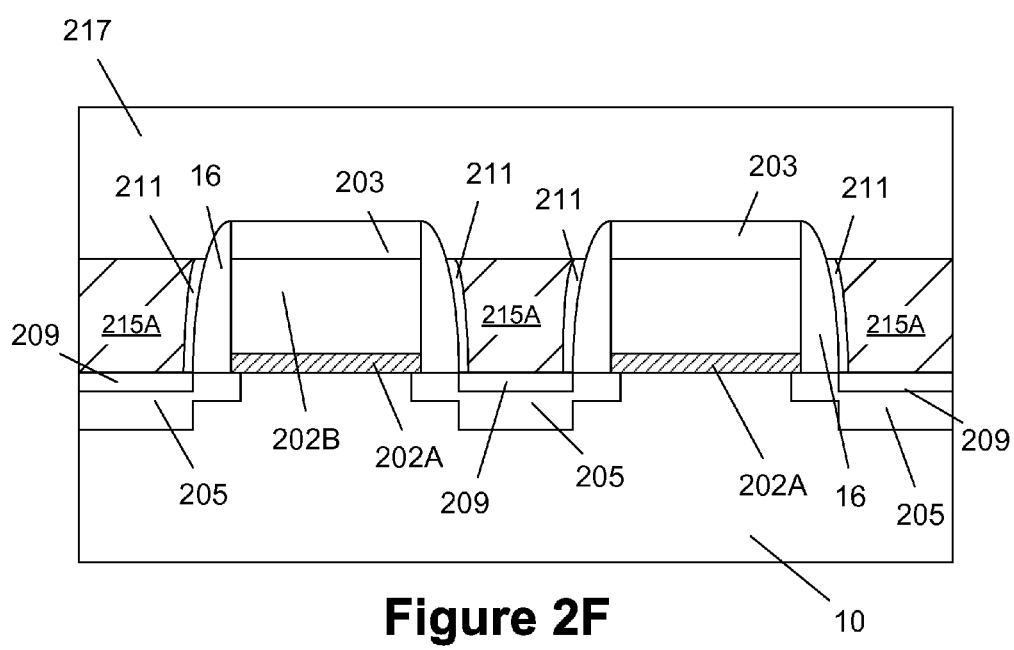

Then, as shown in FIG. 2F, a planarization layer 217 is blanket-deposited above the device 200. The planarization layer 217 may be comprised of a variety of different materials such as, for example, silicon dioxide, silicon nitride, silicon oxynitride, if may be formed by performing a variety of processes and it may have a thickness that ranges from about 50-300 nm. In one illustrative embodiment, the planarization layer 217 is a layer of silicon dioxide that is formed by performing a chemical vapor deposition (CVD) process.

Figure 2G:
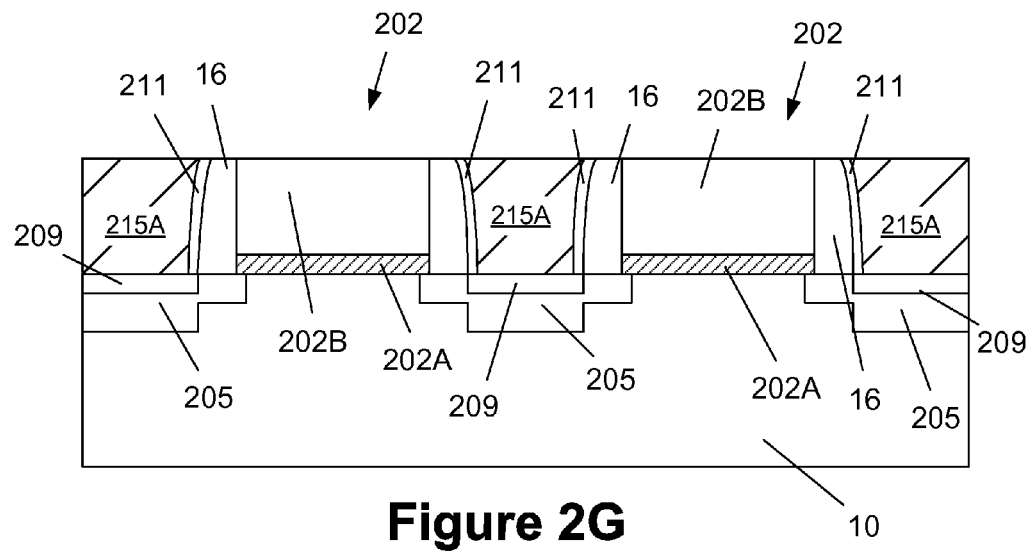

Next, as shown in FIG. 2G, a planarization process, e.g., a chemical mechanical polishing (CMP) process is performed to remove the protective cap layer 203 and exposed the sacrificial gate structures 202 so that they may be removed to thereby define a gate opening where a replacement gate structure will be formed. More specifically, in one illustrative example one or more etching processes are performed to remove the sacrificial gate electrode 202B and the sacrificial gate insulation layer 202A to thereby define a gate opening where a replacement gate structure will subsequently be formed. A masking layer that is typically used in such etching processes is not depicted for purposes of clarity. Typically, the sacrificial gate insulation layer 202A is removed as part of the replacement gate technique, as depicted herein. However, the sacrificial gate insulation layer 202A may not be removed in all applications as it may simply be reduced in thickness or replaced by another oxide before a high-k material is deposited.

Figure 2H:
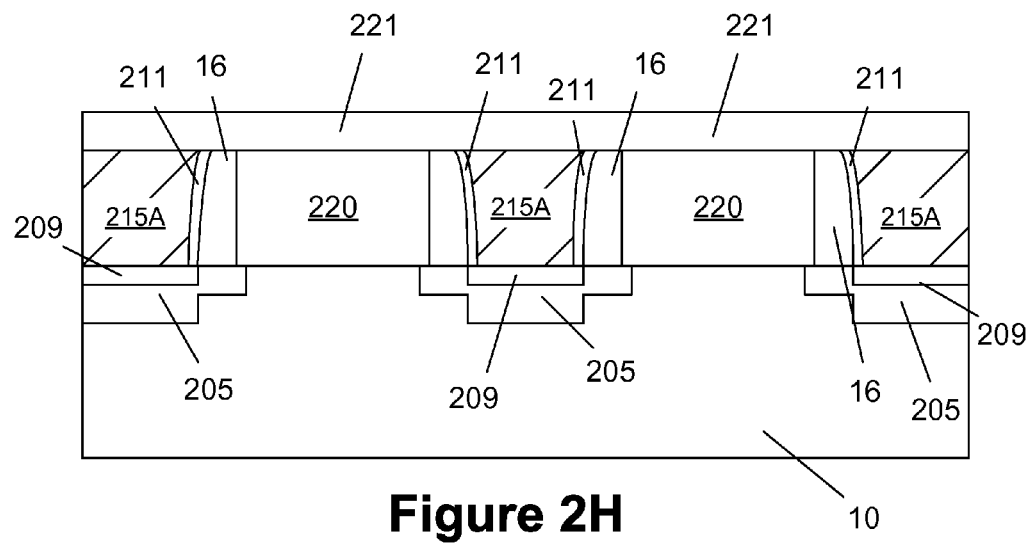

FIG. 2H depicts the device 200 after several process operations have been performed. More specifically, illustrative and schematically depicted replacement gate structures 220 may be formed in the gate openings that were formed when the sacrificial gate structures 202 were removed. Thereafter, a protective cap layer 221 is formed above the device 200 so as to protect the replacement gate structures 220 during subsequent processing operations. In one illustrative example, the replacement gate structure 220 is comprised of a high-k gate insulation layer, a work-function adjusting layer comprised of a metal (e.g., a layer of titanium nitride) and a bulk metal layer (e.g., aluminum). The replacement gate structure 230 may be formed using a variety of known techniques such as those described in the background section of this application. As will be recognized by those skilled in the art after a complete reading of the present application, the insulating materials and the metal layer(s) that are part of the replacement gate structure 220 may be of any desired construction and comprised of any of a variety of different materials. Additionally, the replacement gate structure 220 for a NMOS device may have different material combinations as compared to a replacement gate structure 220 for a PMOS device. Thus, the particular details of construction of replacement gate structure 220, and the manner in which such replacement gate electrode structure 220 is formed, should not be considered a limitation of the present invention unless such limitations are expressly recited in the attached claims. The methods disclosed herein may also be employed replacement gate structures 220 that do not employ a high-k gate insulation layer; although a high-k gate insulation layer will likely be used in most applications.

At the point depicted in FIG. 2H, additional processing operations may be performed to complete the formation of the device 200, such as the formation of multiple metallization layers (not shown) above the device 200 using known techniques. Of course, the total number of metallization layers may vary depending on the particular device under construction. It should also be noted that, in some embodiments, after the metal silicide regions 209 are formed, as shown in FIG. 2C, traditional processing operations may be performed to form conductive contacts that are conductively coupled to the metal silicide regions 209. For example, instead of using the illustrative in situ metal deposition process 213 to form the metal layer 215, a metal layer may simply be deposited on the device 200 using a traditional process, such as a CVD or a PVD process. For example, a layer of aluminum or tungsten may be blanket-deposited on the device 200 in lieu or using the illustrative in situ metal deposition process 213 to form the metal layer 215. Thereafter, the etch-back and planarization processes described above may be performed on the device 200 and the replacement gate structures 220 may be formed as describe above. In short, a semiconductor device described herein may only employ the metal silicide regions 209 (and perhaps the metal layer 211) while using conductive contacts that are formed using any technique.

Figure 3A:
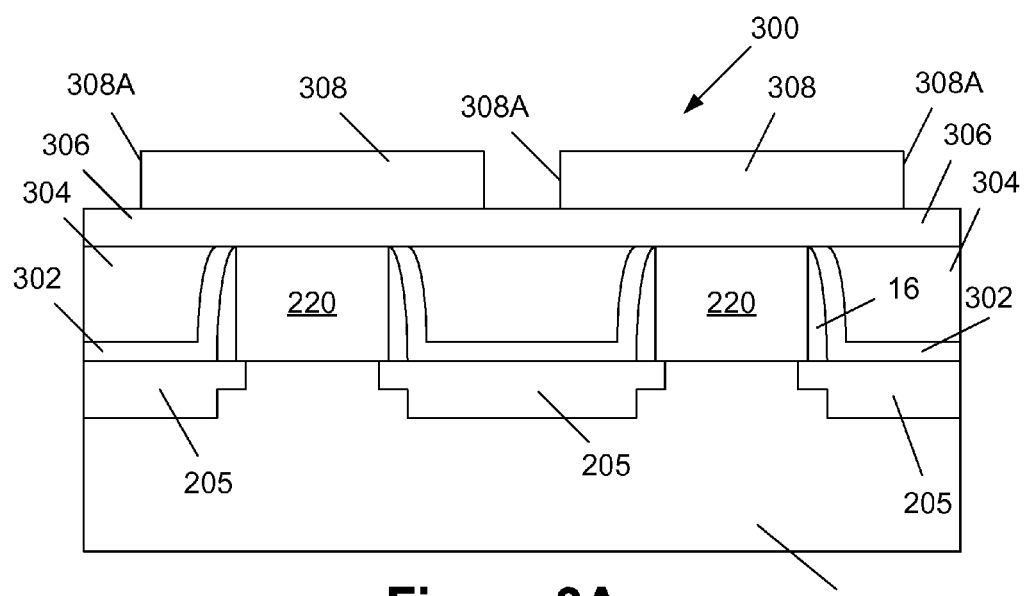
FIGS. 3A-3D depict various illustrative examples of using one another illustrative technique disclosed herein to form metal silicide regions on a semiconductor device.

FIGS. 3A-3D depict another illustrative technique form forming metal silicide regions on semiconductor devices. FIG. 3A depicts an illustrate semiconductor device 300 after several process operations have been formed on the device 300. More specifically, the device 300 comprises illustrative replacement gate structures 220, sidewall spacers 16, source/drain regions 205, an optional etch stop layer 302, a layer of insulating material 304, a protective cap layer 306 and a patterned mask layer 308 having openings 308A formed therein. The various components and structures of the device 300 may be formed using a variety of different materials and by performing a variety of known techniques. To the extent the device 300 uses structures previously described, e.g., replacement gate structures 220, source/drain regions 205, the description of those structures applies equally to the device 300. In one illustrative embodiment, the etch stop layer 302, if employed may a layer of silicon nitride having a thickness of about 10-15 nm, the layer of insulating material 304 may be comprised of silicon dioxide or a low-k material, and the protective cap layer 306 may be a layer of silicon nitride having a thickness of, for example, about 30-50 nm. The patterned mask layer 308 may be a layer of photoresist that may be formed using traditional photolithography techniques.

Figure 3B:
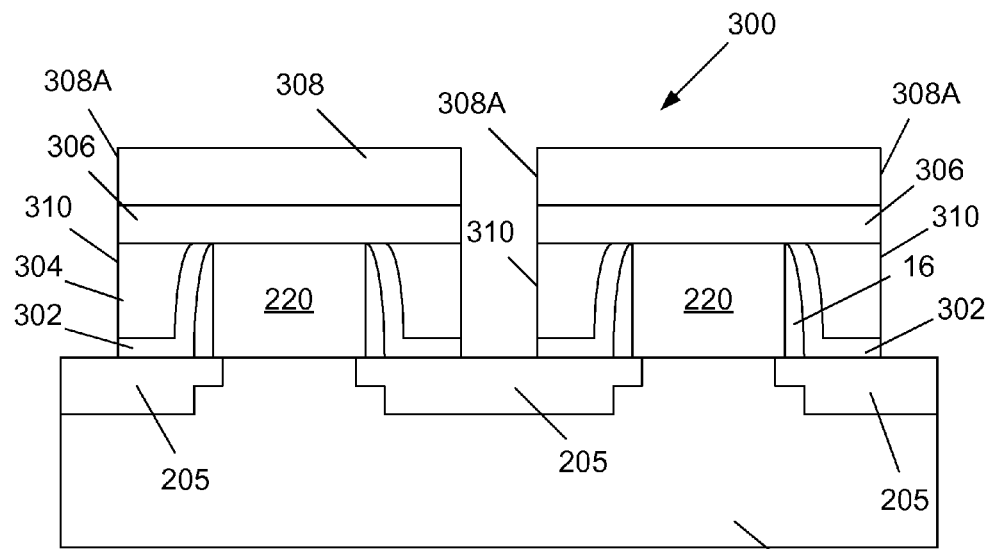

Next, as shown in FIG. 3B, using appropriate etch chemistries, one or more etching processes are performed through the patterned mask layer 308 to define contact openings 310 wherein conductive contacts (not shown in FIG. 3B) will be formed. More specifically, the etching processes are performed through the various layers of material, 306, 304 and 302, to expose the substrate 10 and the source/drain regions 205 for further processing. The etching processes may be either a wet or dry etching process. The size, shape and configuration of the contact openings 310 may vary depending upon the particular application.

Figure 3C:
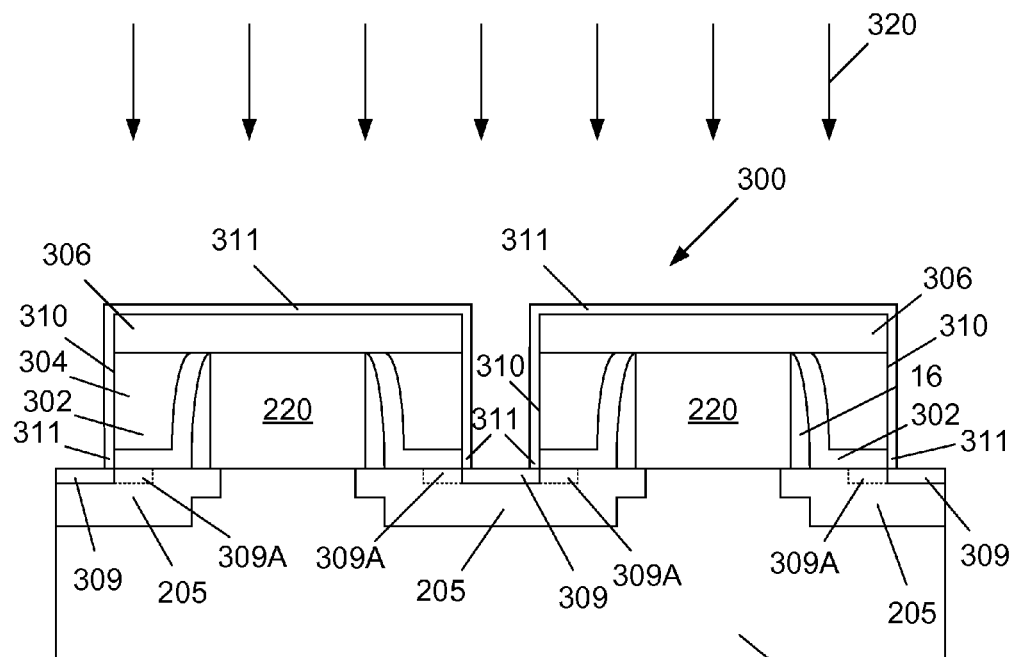

Next, as shown in FIG. 3C, a metal silicide formation process 320 is performed on the device 300 to form metal silicide regions 309 in the silicon source/drain regions 205. The metal silicide formation process 320 also form a thin metal layer 311 on the exposed surfaces of the silicon nitride protective cap layer 206 and the silicon nitride etch stop layer 302. In one illustrative example, the metal silicide formation process 320 is a selective metal silicide formation process that begins with a relatively low temperature process whereby a metal layer 311 is selectively formed on exposed surfaces and the temperature is increased, either during or after the formation of the initial metal layer, so as to ultimately form a metal silicide region at the location where the metal layer 311 is in contact with silicon, i.e., the source/drain regions 205. By forming the resulting metal silicide regions 209 directly as a result of the metal silicide formation process 320, the present method enables the formation of the metal silicide regions 309 in a more cost-efficient manner that involves fewer steps. For example, using this technique, the prior art silicidation steps of heating a deposited layer of refractory metal, stripping the unreacted portions of the refractory metal and performing a heating process to convert the metal silicide to a desirable final phase may be omitted if desired.

The metal silicide regions 309 may be made of a variety of different metal silicides, e.g., nickel silicide, cobalt silicide, etc. The thickness of the metal silicide regions 309 may vary depending upon a variety of factors, such as the parameters of the metal silicide formation process 320, etc. In one illustrative embodiment, the metal silicide regions 309 may have a thickness that ranges from about 10-30 nm, while the metal layer 311 may have a thickness of about 1-3 nm, although these thicknesses may vary depending upon the particular application.

In one illustrative embodiment, the metal silicide formation process 320 may be a plasma enhance chemical vapor deposition (PECVD) based process that is performed at a relatively low temperature, e.g., 400° C. or less, although other deposition processes and temperatures may be employed, e.g., atomic layer deposition (ALD), etc. In one very specific example, the metal silicide formation process 320 may be performed at a temperature of about 250° C. for a duration of about 1-2 minutes using cyclopentadienylallylnickel at a flow rate of about 10-500 slm as a precursor wherein the cyclopentadienylallylnickel may begin to decompose at temperature of approximately 200° C. and to react directly with the exposed silicon substrate 10 to form nickel silicide regions 309 in the source/drain regions 205. Depending upon the parameters of the process 320 and the gases used in the process, the resulting metal silicide regions 309 may actually migrate under adjacent structures, such as the etch stop layer 302. Such extended or migrated metal silicide regions 309A are depicted in dashed lines in FIG. 3C. In some cases, platinum may be added to reduce or eliminate such migration if desired.

In another illustrative embodiment, where it is desired to form cobalt silicide regions 309, the metal silicide formation process 320 may be a plasma enhance chemical vapor deposition (PECVD) based process that is performed at a relatively low temperature, e.g., 400° C. or less, although other deposition processes and temperatures may be employed, e.g., atomic layer deposition (ALD), etc. In one very specific example, the metal silicide formation process 320 may be performed at a temperature of about 250° C. for a duration of about 1-2 minutes using nitroxy radicals at a flow rate of about 10-500 slm as a precursor wherein the nitroxy radicals react directly with the exposed silicon substrate 10 to form cobalt silicide regions 309 in the source/drain regions 205.

Figure 3D:
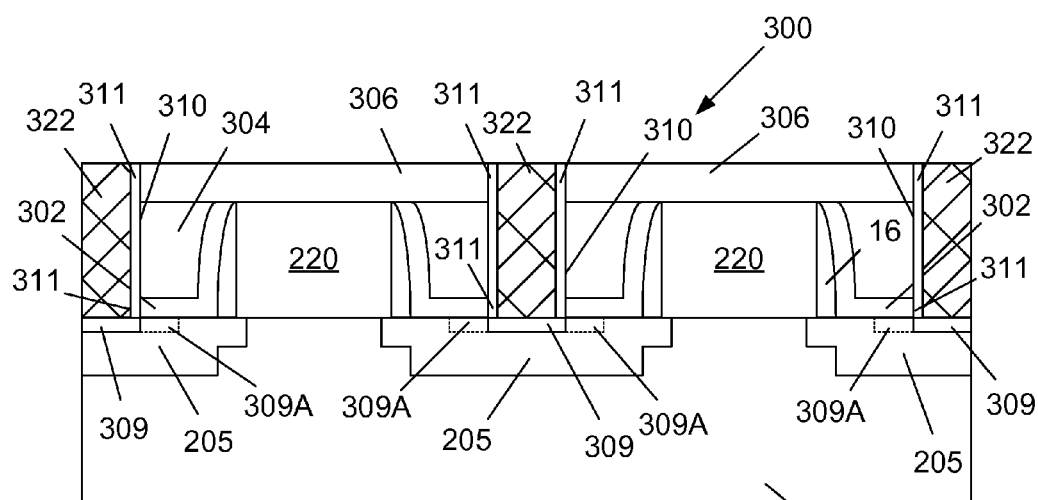

Next, as shown in FIG. 3D, traditional processing operations may be performed to form conductive contacts 322 in the contact openings 310 wherein the conductive contacts 322 are conductively coupled to the metal silicide regions 309. That is, one or more barrier layers and a bulk metal layer may simply be deposited on the device 300 using a traditional process, such as a CVD or a PVD process. For example, a layer of aluminum or tungsten may be blanket-deposited on the device 300. Thereafter, a CMP process may be performed on the device 300 using the protective cap layer 306 as a polish stop layer to result in the structure depicted in FIG. 3D. At the point depicted in FIG. 3D, additional processing operations may be performed to complete the formation of the device 300, such as the formation of multiple metallization layers (not shown) above the device 300 using known techniques. Of course, the total number of metallization layers may vary depending on the particular device under construction.

Figure 4A:
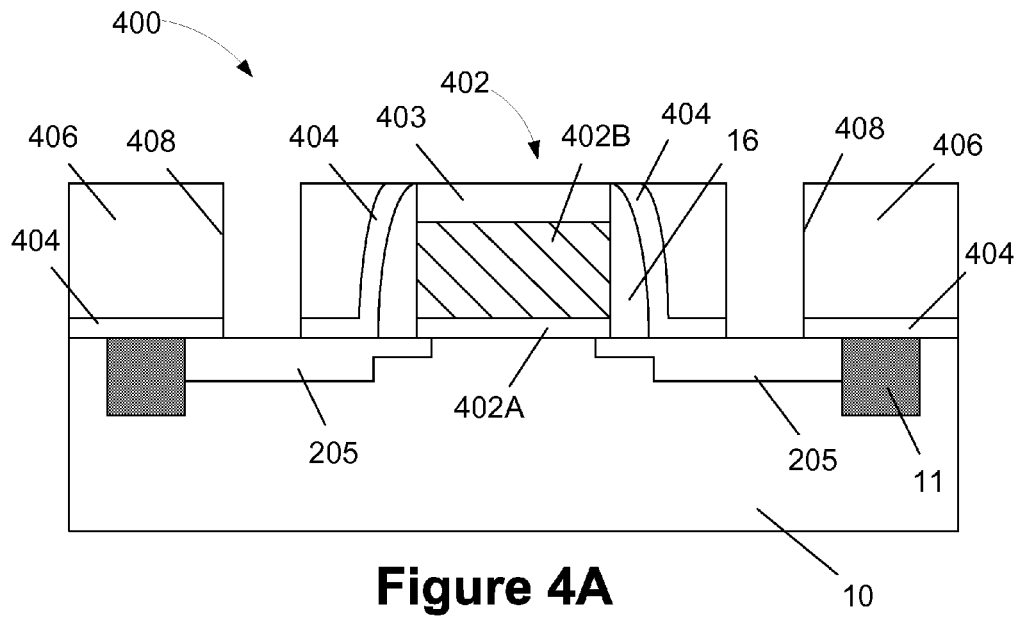
FIGS. 4A-4D depict various illustrative examples of using yet another illustrative technique disclosed herein to form metal silicide regions on a semiconductor device.

FIGS. 4A-4D depict another illustrative technique form forming metal silicide regions on semiconductor devices. FIG. 4A depicts an illustrate semiconductor device 400 after several process operations have been formed on the device 400. More specifically, the device 400 comprises an illustrative gate structure 402, a protective gate cap layer 403, sidewall spacers 16, source/drain regions 205, an etch stop layer 404 and a layer of insulating material 406 having contact openings 408 formed therein. The various components and structures of the device 400 may be formed using a variety of different materials and by performing a variety of known techniques. To the extent the device 400 uses structures previously described, e.g., source/drain regions 205, the description of those structures applies equally to the device 400. In one illustrative embodiment, the etch stop layer 404, if employed may a layer of silicon nitride having a thickness of about 10-15 nm, the layer of insulating material 406 may be comprised of silicon dioxide or a low-k material, and the protective gate cap layer 403 may be a layer of silicon nitride having a thickness of, for example, about 30-50 nm.

The gate electrode structure 402 is generally comprised of a gate insulation layer 402A and a conductive gate electrode 302B. The gate electrode structure 402 it may be formed using a variety of different materials and by performing a variety of known techniques. For example, the gate insulation layer 402A may be comprised of silicon dioxide and the gate electrode 402B may be comprised of polysilicon or amorphous silicon. The gate electrode structure 402 may be made using a gate-first technique wherein a layer of gate insulation material is formed on the substrate, a layer of gate electrode material is formed on the gate insulation layer and a layer of material that will serve as the gate cap layer if formed above the layer of gate electrode material. Thereafter, one or more etching processes are performed to define the basic stack of material layers depicted in FIG. 4A.

With continuing reference to FIG. 4A, using appropriate etch chemistries, one or more etching processes are performed through a patterned mask layer (not shown in FIG. 4A) to define contact openings 408 wherein conductive contacts (not shown in FIG. 4A) will be formed. More specifically, the etching processes are performed through the various layers of material, 406 and 404 to expose the substrate 10 and the source/drain regions 205 for further processing. The etching processes may be either a wet or dry etching process. The size, shape and configuration of the contact openings 408 may vary depending upon the particular application.

Figure 4B:
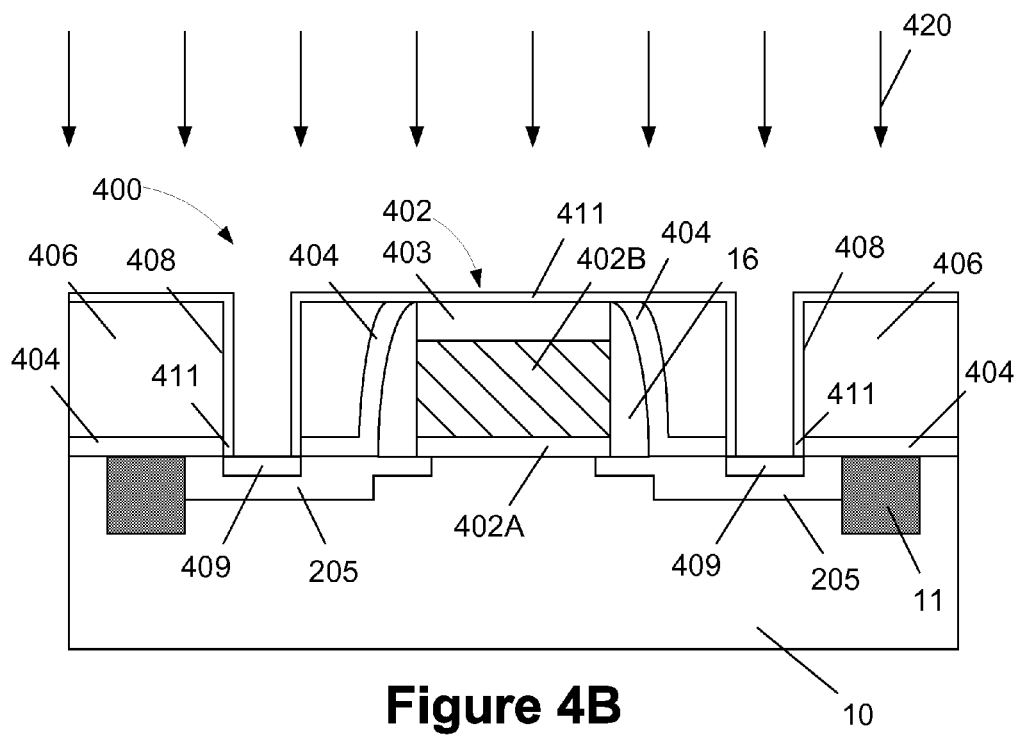

Next, as shown in FIG. 4B, a metal silicide formation process 420 is performed on the device 400 to form metal silicide regions 409 in the source/drain regions 205. The metal silicide deposition process 420 also forms a thin metal layer 411 on the exposed surfaces of the silicon nitride protective gate cap layer 404 and the silicon nitride etch stop layer 404. In one illustrative example, the metal silicide formation process 420 is a selective metal silicide formation process that begins with a relatively low temperature process whereby a metal layer 411 is selectively formed on exposed surfaces and the temperature is increased, either during or after the formation of the initial metal layer 411, so as to ultimately form a metal silicide region at the location where the metal layer 411 contacts silicon, i.e., where the metal layer 411 contacts the source/drain regions 205. In one illustrative embodiment, the metal silicide formation process 420 may be the same as the metal silicide formation process 207 or the metal silicide formation process 320, both of which were previously described. By forming the resulting metal silicide regions 409 directly as a result of the metal silicide formation process 420, the present method enables the formation of the metal silicide regions 409 in a more cost-efficient manner that involves fewer steps. For example, using this technique, the prior art silicidation steps of heating a deposited layer of refractory metal, stripping the unreacted portions of the refractory metal and performing a heating process to convert the metal silicide to a desirable final phase may be omitted if desired.

The metal silicide regions 409 may be made of a variety of different metal silicides, e.g., nickel silicide, cobalt silicide, etc. The thickness of the metal silicide regions 409 and the metal layer 411 may vary depending upon a variety of factors, such as the parameters of the metal silicide deposition process 420, the particular metal silicide being formed, etc. In one illustrative embodiment, the metal silicide regions 409 may have a thickness that ranges from about 10-30 nm, while the metal silicide layer 411 may have a thickness of about 1-3 nm, although these thicknesses may vary depending upon the particular application.

Figure 4C:
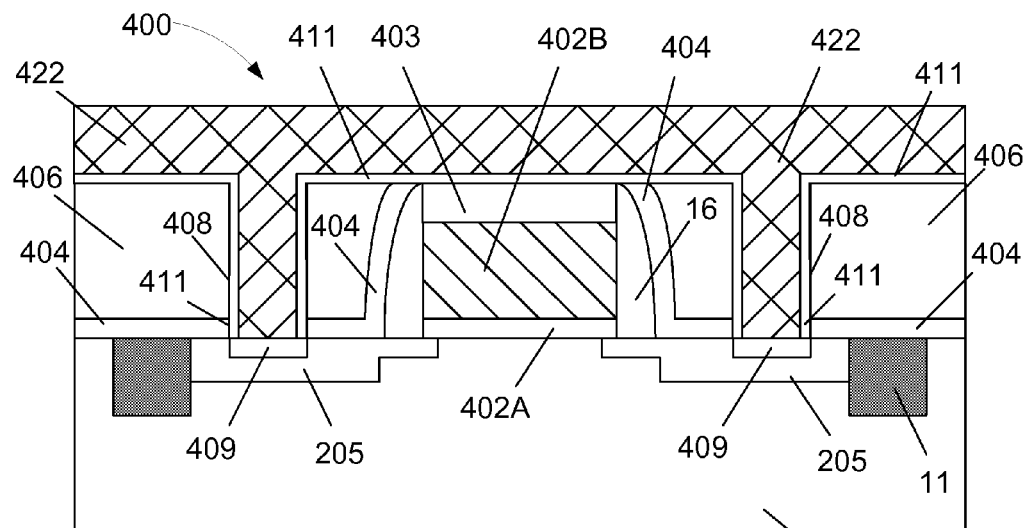
Figure 4D:
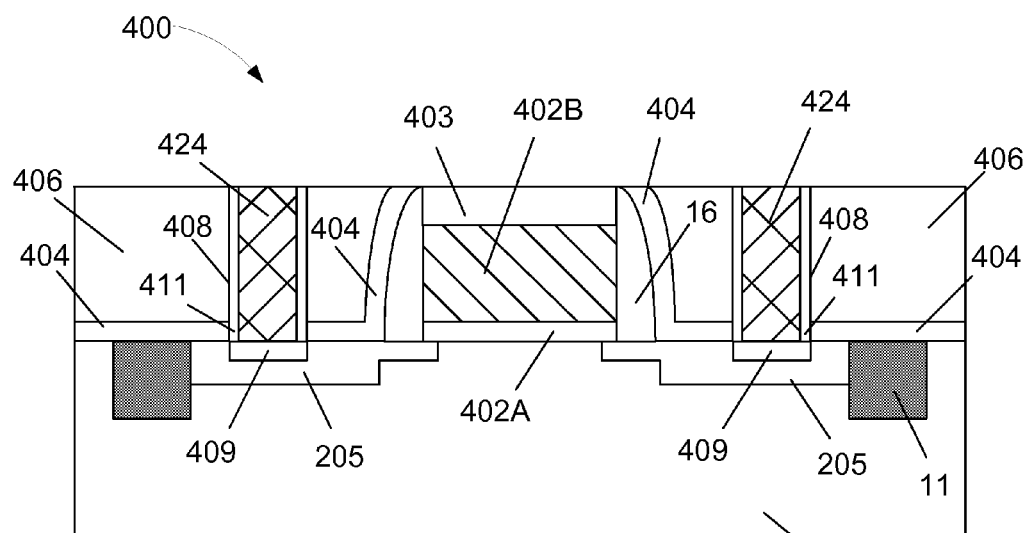

Next, as shown in FIGS. 4C-4D, conductive contacts 424 are formed in the contact openings 408 using a variety of techniques. In one example, where the metal silicide formation process 207 is used, the process gases used in the metal silicide formation process 207 are changed and the previously described metal deposition process 213 is performed to form a metal layer 422 above the device 400. In one illustrative embodiment, the metal formation process 213 may be performed in situ, i.e., in the same process chamber in which the metal silicide formation process 207 was performed without removing the device 400 from the process chamber. In other illustrative embodiments, the metal deposition process 213 may be performed as a stand-alone process in a separate process chamber or tool. In other cases, traditional processing operations may be performed to form the conductive contacts 424 in the contact openings 408 wherein the conductive contacts 424 are conductively coupled to the metal silicide regions 409. That is, one or more barrier layers and a bulk metal layer may simply be deposited on the device 400 using a traditional process, such as a CVD or a PVD process. For example, a layer of aluminum or tungsten may be blanket-deposited on the device 400. Thereafter, a CMP process may be performed on the device 400 using the protective gate cap layer 403 as a polish stop layer to result in the structure depicted in FIG. 4D. At the point depicted in FIG. 4D, additional processing operations may be performed to complete the formation of the device 400, such as the formation of multiple metallization layers (not shown) above the device 400 using known techniques. Of course, the total number of metallization layers may vary depending on the particular device under construction.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a sacrificial gate structure above a semiconducting substrate;
    performing a selective metal silicide formation process to form metal silicide regions in source/drain regions formed in or above said substrate, wherein performing said selective metal silicide formation process to form said metal silicide regions comprises performing said selective metal silicide formation process to form metal silicide regions comprised of cobalt silicide using a nitroxy radical as a precursor;
    after forming said metal silicide regions, removing said sacrificial gate structure to define a gate opening; and
    forming a replacement gate structure in said gate opening, said replacement gate structure comprised of at least one metal layer.

2. The method of claim 1, further comprising forming a protective layer above said replacement gate structure.

3. The method of claim 1, further comprising:
    forming a sidewall spacer proximate said sacrificial gate structure; and
    forming a protective gate cap layer above said sacrificial gate structure, wherein performing said selective metal silicide formation process further forms a first metal layer on said sidewall spacer and said protective gate cap layer.

4. The method of claim 3, further comprising, after performing said selective metal silicide formation process, performing a metal deposition process to form a second metal layer above said first metal layer and said metal silicide regions.

5. The method of claim 4, wherein said metal deposition process is performed in situ in a process chamber in which said selective metal silicide formation process was performed without removing said substrate from said process chamber.

6. The method of claim 1, wherein performing said selective metal silicide formation process comprises performing a deposition process to form a source layer of metal at a temperature that is at least as high as a metal silicide formation temperature for said source layer of metal.

7. A method, comprising:
    forming a plurality of sacrificial gate structures above a semiconducting substrate;
    forming a sidewall spacer proximate each of said sacrificial gate structures;
    forming a protective gate cap layer above each of said sacrificial gate structures;
    performing a selective metal silicide formation process to form a metal silicide region in a source/drain region formed in or above said substrate between said sacrificial gate structures and to form a metal layer on at least said sidewall spacer, wherein performing said selective metal silicide formation process to form said metal silicide region comprises performing said selective metal silicide formation process to form the metal silicide region comprised of cobalt silicide using a nitroxy radical as a precursor;
    after performing said selective metal silicide formation process, performing a metal deposition process to form a metal layer above said metal silicide region at least between said sidewall spacers on said sacrificial gate structures; and
    performing a planarization process on at least said metal layer to define a contact structure positioned above said metal silicide region between said sidewall spacers on said sacrificial gate structures.

8. The method of claim 7, further comprising:
after forming said contact structure, removing said sacrificial gate structures to define a plurality of gate openings; and
forming a replacement gate structure in each of said gate openings, said replacement gate structure comprised of at least one metal layer.

9. The method of claim 7, wherein performing said selective metal silicide formation process further forms a metal layer on said protective gate cap layer.

10. The method of claim 7, wherein said metal deposition process is performed in situ in a process chamber in which said selective metal silicide formation process was performed without removing said substrate from said process chamber.

11. The method of claim 7, wherein said metal deposition process is performed in situ in a process chamber in which said selective metal silicide formation process was performed without removing said substrate from said process chamber and wherein nitrogen is introduced into said process chamber during said metal deposition process.

12. The method of claim 7, wherein performing said selective metal silicide formation process comprises performing a deposition process to form a source layer of metal at a temperature that is at least as high as a metal silicide formation temperature for said source layer of metal.

13. A method, comprising:
forming a sacrificial gate structure above a semiconducting substrate;
removing said sacrificial gate structure to define a gate opening;
forming a replacement gate structure in said gate opening, said replacement gate structure comprised of at least one metal layer; and
performing a selective metal silicide formation process to form metal silicide regions in source/drain regions formed in or above said substrate, wherein performing said selective metal silicide formation process to form said metal silicide regions comprises performing said selective metal silicide formation process to form metal silicide regions comprised of cobalt silicide using a nitroxy radical as a precursor.

14. The method of claim 13, further comprising forming a protective layer above said replacement gate structure.

15. The method of claim 13, wherein said selective metal silicide formation process is performed at a temperature less than 400° C.

16. The method of claim 13, further comprising:
forming an etch stop layer proximate said sacrificial gate structure; and
forming a protective cap layer above said replacement gate structure, wherein performing said selective metal silicide formation process further forms a metal layer on said etch stop layer and said protective gate layer.

17. A method, comprising:
forming a plurality of replacement gate structures above a semiconducting substrate;
forming a plurality of source/drain regions in or above said substrate proximate each of said replacement gate structures;
forming a layer of insulating material above said substrate between said replacement gate structures,
forming a protective cap layer above said replacement gate structures and said layer of insulating material;
forming an contact opening in at least said protective cap layer and said layer of insulating material, said contact opening exposing at least a portion of one of said source/drain regions; and
performing a selective metal silicide formation process through said contact opening to form a metal silicide region in said exposed portion of said source/drain region, wherein performing said selective metal silicide formation process to form said metal silicide region comprises performing said selective metal silicide formation process to form said metal silicide region comprised of cobalt silicide using a nitroxy radical as a precursor.

18. The method of claim 17, further comprising after forming said metal silicide region, forming a conductive contact in said contact opening, said conductive contact being conductively couple to said metal silicide region.

19. The method of claim 17, wherein said selective metal silicide formation process is performed at a temperature less than 400° C.

* * * * *